(12) United States Patent
Ma

(10) Patent No.: US 9,030,829 B2
(45) Date of Patent: May 12, 2015

(54) MODULAR ACCESSORY

(71) Applicant: Oliver Joen-an Ma, Arcadia, CA (US)

(72) Inventor: Oliver Joen-an Ma, Arcadia, CA (US)

( * ) Notice: Subject to any disclaimer, the term of this patent is extended or adjusted under 35 U.S.C. 154(b) by 0 days.

(21) Appl. No.: 13/657,116

(22) Filed: Oct. 22, 2012

(65) Prior Publication Data

US 2014/0111948 A1    Apr. 24, 2014

(51) Int. Cl.
| | |
|---|---|
| *A45B 3/00* | (2006.01) |
| *H05K 7/00* | (2006.01) |
| *A45B 3/04* | (2006.01) |
| *A45B 3/02* | (2006.01) |
| *A45B 23/00* | (2006.01) |

(52) U.S. Cl.
CPC ... *A45B 3/00* (2013.01); *A45B 3/02* (2013.01); *A45B 3/04* (2013.01); *A45B 23/00* (2013.01); *A45B 2023/0037* (2013.01); *A45B 2200/1009* (2013.01); *A45B 2200/1018* (2013.01); *A45B 2200/1027* (2013.01)

(58) Field of Classification Search
CPC .................................... A45B 3/00; H05K 7/00
USPC ................. 361/729; 135/16, 28; 362/102
See application file for complete search history.

(56) References Cited

U.S. PATENT DOCUMENTS

| | | | |
|---|---|---|---|
| 2,047,045 A | 7/1936 | Veenboer | |
| 2,087,537 A | 7/1937 | Milton | |
| 2,176,667 A | 10/1939 | Crowley | |
| 2,547,896 A | 4/1951 | Cafardi | |
| 2,960,094 A | 11/1960 | Cohen | |
| 3,449,002 A | 6/1969 | Bernard | |
| 3,683,172 A | 8/1972 | Noyes | |
| 3,752,407 A | 8/1973 | Baugh | |
| 3,801,809 A | 4/1974 | Slade | |
| 4,020,858 A | 5/1977 | Wilson | |
| 4,174,532 A | 11/1979 | Kelley | |
| 4,225,909 A | 9/1980 | Scholz | |
| 4,425,602 A | 1/1984 | Lansing | |
| D283,647 S | 4/1986 | Schumann | |
| 4,601,120 A | 7/1986 | Levin | |

(Continued)

FOREIGN PATENT DOCUMENTS

| | | |
|---|---|---|
| CN | 201025354 | 2/2008 |
| CN | 202262527 | 6/2012 |

(Continued)

OTHER PUBLICATIONS

Extended European Search Report issued in European Patent Application No. 13189717.5, dated Feb. 27, 2014, in 5 pages.

(Continued)

*Primary Examiner* — Lisa Lea Edmonds
*Assistant Examiner* — Rashen E Morrison
(74) *Attorney, Agent, or Firm* — Knobbe Martens Olson & Bear LLP

(57) ABSTRACT

An accessory is provided that includes power supply module, a first functional module, and a second functional module. The power supply module can be configured to be suspended beneath an overhead support, such as a hub of an umbrella. The first functional module is configured to affix to the power supply module and to be powered by the power supply module to provide a user directed function. The second functional module is configured to be detachably coupled to either the power supply module or the first functional module to receive power from the power supply module directly or through the first functional module.

24 Claims, 8 Drawing Sheets

(56) References Cited

U.S. PATENT DOCUMENTS

| | | | |
|---|---|---|---|
| 4,628,791 A | 12/1986 | Phipps | |
| 4,684,230 A | 8/1987 | Smith | |
| 4,787,019 A * | 11/1988 | van den Broeke | 362/249.07 |
| 4,788,995 A | 12/1988 | Rushing | |
| 4,800,909 A | 1/1989 | Seidel et al. | |
| 4,867,187 A | 9/1989 | Divine | |
| 4,872,468 A | 10/1989 | Cole | |
| 4,881,154 A | 11/1989 | Tseng | |
| 4,915,670 A * | 4/1990 | Nesbit | 455/344 |
| 4,953,839 A | 9/1990 | Chern | |
| 4,962,779 A | 10/1990 | Meng | |
| 5,007,811 A * | 4/1991 | Hopkins | 135/16 |
| 5,029,239 A * | 7/1991 | Nesbit | 455/344 |
| 5,053,931 A | 10/1991 | Rushing | |
| 5,055,984 A | 10/1991 | Hung et al. | |
| 5,116,258 A | 5/1992 | Vennik | |
| 5,126,922 A | 6/1992 | Andreasen | |
| 5,143,108 A | 9/1992 | Kenney | |
| 5,150,963 A | 9/1992 | Hill | |
| 5,152,495 A | 10/1992 | Jacinto | |
| 5,163,752 A | 11/1992 | Copeland et al. | |
| 5,172,711 A | 12/1992 | Mueller | |
| 5,207,238 A * | 5/1993 | Rivera et al. | 135/16 |
| 5,213,122 A | 5/1993 | Grady | |
| 5,216,948 A | 6/1993 | Sheppard et al. | |
| D341,831 S | 11/1993 | Mozdzanowski | |
| 5,273,062 A * | 12/1993 | Mozdzanowski | 135/16 |
| 5,275,364 A | 1/1994 | Burger | |
| 5,280,799 A | 1/1994 | Alajajian | |
| 5,291,908 A | 3/1994 | Grady, II | |
| 5,321,579 A | 6/1994 | Brown et al. | |
| 5,323,798 A | 6/1994 | Yang | |
| 5,331,524 A | 7/1994 | Tseng | |
| 5,349,975 A * | 9/1994 | Valdner | 135/16 |
| 5,351,173 A * | 9/1994 | Byrne | 362/127 |
| 5,422,801 A | 6/1995 | Sangalli, Jr. | |
| 5,426,577 A | 6/1995 | Gordin et al. | |
| 5,449,012 A | 9/1995 | Friedman | |
| 5,463,535 A | 10/1995 | Vest | |
| 5,502,624 A | 3/1996 | Tu | |
| 5,584,564 A | 12/1996 | Phyle | |
| 5,611,614 A | 3/1997 | Morgan | |
| 5,683,064 A | 11/1997 | Copeland et al. | |
| 5,683,070 A | 11/1997 | Seed | |
| 5,707,135 A | 1/1998 | Miller | |
| 5,816,685 A | 10/1998 | Hou | |
| 5,831,413 A | 11/1998 | Gould | |
| 5,860,728 A | 1/1999 | Maglica | |
| 5,902,080 A | 5/1999 | Kopras | |
| D413,992 S | 9/1999 | Muhammad | |
| 5,954,417 A | 9/1999 | Mai | |
| 5,960,805 A | 10/1999 | Murphy | |
| 5,964,233 A | 10/1999 | Clark et al. | |
| 5,996,511 A * | 12/1999 | Swoger | 108/157.13 |
| 6,013,985 A | 1/2000 | Green et al. | |
| 6,017,188 A | 1/2000 | Benton | |
| 6,024,464 A | 2/2000 | De Vera | |
| 6,027,309 A * | 2/2000 | Rawls et al. | 416/5 |
| 6,039,062 A | 3/2000 | Karakaedos | |
| 6,058,951 A | 5/2000 | Wilson | |
| 6,089,727 A | 7/2000 | Wu | |
| 6,126,291 A | 10/2000 | Chung-Kuang et al. | |
| 6,126,293 A | 10/2000 | Wu | |
| 6,134,103 A | 10/2000 | Ghanma | |
| 6,135,605 A | 10/2000 | Hsu | |
| 6,138,970 A | 10/2000 | Sohrt | |
| 6,158,451 A | 12/2000 | Wu | |
| 6,158,701 A | 12/2000 | Deshler | |
| 6,196,242 B1 | 3/2001 | Xu | |
| 6,270,230 B1 | 8/2001 | Mai | |
| 6,283,610 B1 | 9/2001 | Alajajian | |
| 6,298,866 B1 * | 10/2001 | Molnar, IV | 135/16 |
| 6,340,233 B1 | 1/2002 | Shieh | |
| 6,341,873 B1 | 1/2002 | Yang | |
| 6,347,776 B1 * | 2/2002 | Chuang | 248/288.51 |
| 6,382,809 B1 | 5/2002 | Ou-Yang | |
| 6,397,869 B1 | 6/2002 | Jennings | |
| 6,412,889 B1 | 7/2002 | Hummell et al. | |
| 6,439,249 B1 * | 8/2002 | Pan et al. | 135/16 |
| 6,439,732 B1 | 8/2002 | Weisbach et al. | |
| 6,519,144 B1 | 2/2003 | Henrie et al. | |
| 6,598,990 B2 * | 7/2003 | Li | 362/102 |
| 6,612,713 B1 | 9/2003 | Kuelbs | |
| 6,636,918 B1 | 10/2003 | Aguilar et al. | |
| 6,659,616 B1 | 12/2003 | Bilotti | |
| 6,666,224 B2 | 12/2003 | Lee | |
| 6,682,204 B2 | 1/2004 | Mullally et al. | |
| 6,692,135 B2 | 2/2004 | Li | |
| 6,732,752 B2 | 5/2004 | Cohen et al. | |
| 6,749,166 B2 | 6/2004 | Valentine et al. | |
| 6,765,789 B2 | 7/2004 | Yang | |
| 6,796,318 B2 | 9/2004 | Cohen et al. | |
| 6,830,058 B2 * | 12/2004 | Li | 135/16 |
| 6,837,255 B2 | 1/2005 | Bunch | |
| 6,840,657 B2 | 1/2005 | Tung | |
| 6,851,823 B2 | 2/2005 | Bilotti | |
| 6,923,193 B2 | 8/2005 | Chen | |
| 6,923,194 B2 | 8/2005 | Li | |
| 6,959,996 B2 | 11/2005 | Ip | |
| 6,961,237 B2 | 11/2005 | Dickie | |
| 6,966,667 B2 | 11/2005 | Li | |
| 7,013,903 B2 | 3/2006 | Li | |
| 7,017,598 B2 | 3/2006 | Nipke | |
| 7,021,787 B1 | 4/2006 | Kuelbs | |
| 7,034,902 B2 | 4/2006 | Tajima | |
| 7,063,433 B2 | 6/2006 | Pape et al. | |
| 7,108,388 B2 | 9/2006 | Li | |
| 7,111,954 B1 | 9/2006 | Lai | |
| 7,125,133 B2 | 10/2006 | Bilotti et al. | |
| 7,128,076 B2 | 10/2006 | Freedman | |
| 7,134,762 B2 | 11/2006 | Ma | |
| 7,143,601 B1 | 12/2006 | Jimenez | |
| 7,188,633 B2 | 3/2007 | Zerillo | |
| D542,454 S | 5/2007 | Chan | |
| 7,300,189 B2 | 11/2007 | England et al. | |
| 7,331,684 B2 | 2/2008 | Tung | |
| 7,401,936 B1 | 7/2008 | Fan | |
| 7,422,343 B2 | 9/2008 | Li | |
| 7,431,469 B2 | 10/2008 | Li | |
| D580,421 S | 11/2008 | Sculler et al. | |
| 7,481,547 B2 * | 1/2009 | Li | 362/102 |
| 7,497,225 B1 | 3/2009 | Klein, Jr. et al. | |
| 7,497,583 B2 * | 3/2009 | Ma | 362/102 |
| 7,537,015 B1 | 5/2009 | Molnar, IV et al. | |
| 7,557,297 B2 | 7/2009 | Axland et al. | |
| 7,559,520 B2 | 7/2009 | Quijano et al. | |
| 7,562,667 B2 | 7/2009 | Li | |
| 7,593,220 B2 | 9/2009 | Proctor et al. | |
| 7,604,015 B2 | 10/2009 | Fraser | |
| 7,614,600 B1 | 11/2009 | Smith et al. | |
| 7,625,241 B2 | 12/2009 | Axland et al. | |
| 7,625,242 B2 | 12/2009 | Axland et al. | |
| 7,626,119 B2 | 12/2009 | Axland et al. | |
| 7,631,653 B2 | 12/2009 | Young et al. | |
| 7,645,169 B2 | 1/2010 | Axland et al. | |
| 7,648,339 B1 | 1/2010 | Ediger et al. | |
| 7,650,230 B1 | 1/2010 | Laverick et al. | |
| 7,665,477 B1 | 2/2010 | Hathaway | |
| 7,695,153 B2 * | 4/2010 | Tsai | 362/102 |
| 7,753,546 B2 | 7/2010 | Kuelbs | |
| 7,755,975 B2 | 7/2010 | Pettersen et al. | |
| 7,778,624 B2 | 8/2010 | Li | |
| 7,828,002 B2 | 11/2010 | Boldsen | |
| 7,836,905 B2 | 11/2010 | Tarter et al. | |
| 7,856,996 B2 * | 12/2010 | Ma | 135/16 |
| 7,975,711 B2 | 7/2011 | Li | |
| 8,015,988 B2 | 9/2011 | Li | |
| 8,061,374 B2 | 11/2011 | Li | |
| 8,069,868 B2 | 12/2011 | Kuelbs | |
| 8,082,937 B2 | 12/2011 | Tarter et al. | |
| 8,104,491 B2 | 1/2012 | Li | |
| 8,116,497 B2 | 2/2012 | Li | |
| 8,267,104 B2 | 9/2012 | Li | |
| 8,331,598 B2 | 12/2012 | Li | |

(56) References Cited

U.S. PATENT DOCUMENTS

| | | |
|---|---|---|
| 8,345,889 B2 | 1/2013 | Li |
| 8,360,079 B2 | 1/2013 | Li |
| 8,393,341 B2 | 3/2013 | Li |
| 8,444,104 B2 | 5/2013 | Li |
| 8,453,659 B2 | 6/2013 | Li |
| 8,459,282 B2 | 6/2013 | Gorey et al. |
| 2001/0001083 A1 | 5/2001 | Helot |
| 2002/0074027 A1 | 6/2002 | Maidment |
| 2003/0002688 A1 | 1/2003 | Kanevsky et al. |
| 2003/0067765 A1 | 4/2003 | Li |
| 2003/0102021 A1 | 6/2003 | Cohen |
| 2003/0168091 A1 | 9/2003 | Cohen |
| 2003/0192579 A1* | 10/2003 | Llamas Garijo ............... 135/16 |
| 2004/0007259 A1 | 1/2004 | Manolis |
| 2004/0031513 A1 | 2/2004 | Bunch |
| 2004/0055627 A1 | 3/2004 | Moga |
| 2004/0095749 A1 | 5/2004 | Bilotti |
| 2004/0100791 A1 | 5/2004 | Bilotti |
| 2004/0149325 A1 | 8/2004 | Juelbs |
| 2004/0228118 A1 | 11/2004 | Peterson |
| 2004/0240167 A1 | 12/2004 | Ledbetter |
| 2004/0256852 A1 | 12/2004 | Benedict |
| 2005/0016571 A1 | 1/2005 | Wu |
| 2005/0069153 A1 | 3/2005 | Hall |
| 2005/0072451 A1 | 4/2005 | Vivian |
| 2005/0105898 A1 | 5/2005 | Bachinski |
| 2005/0128740 A1 | 6/2005 | Currie et al. |
| 2005/0133077 A1 | 6/2005 | Zerillo |
| 2005/0161067 A1* | 7/2005 | Hollins ............... 135/16 |
| 2005/0254228 A1 | 11/2005 | Li |
| 2006/0005869 A1 | 1/2006 | Kuelbs |
| 2006/0044152 A1 | 3/2006 | Wang |
| 2006/0124122 A1 | 6/2006 | Young |
| 2006/0124157 A1 | 6/2006 | Bayour |
| 2006/0127034 A1 | 6/2006 | Brooking |
| 2006/0196532 A1* | 9/2006 | Tung ............... 135/16 |
| 2006/0266398 A1 | 11/2006 | Wu |
| 2007/0056617 A1 | 3/2007 | Li |
| 2007/0058360 A1 | 3/2007 | Li |
| 2007/0070588 A1 | 3/2007 | Lin |
| 2007/0074751 A1 | 4/2007 | Fraser |
| 2007/0127231 A1 | 6/2007 | Li |
| 2007/0133191 A1* | 6/2007 | Ma ............... 362/102 |
| 2007/0133219 A1 | 6/2007 | Chaloult et al. |
| 2007/0151588 A1 | 7/2007 | Yul et al. |
| 2007/0242450 A1* | 10/2007 | Blatecky ............... 362/102 |
| 2007/0254695 A1 | 11/2007 | Langberg et al. |
| 2007/0279856 A1 | 12/2007 | Bragg |
| 2008/0053496 A1 | 3/2008 | Li |
| 2008/0056898 A1 | 3/2008 | Li |
| 2008/0062675 A1 | 3/2008 | Tung |
| 2008/0072945 A1 | 3/2008 | Grand Pre et al. |
| 2008/0092440 A1 | 4/2008 | Johnson |
| 2008/0092936 A1* | 4/2008 | Carabillo ............... 135/16 |
| 2008/0095382 A1 | 4/2008 | Mott |
| 2008/0118089 A1 | 5/2008 | Li |
| 2008/0163908 A1 | 7/2008 | O'Kere |
| 2008/0238270 A1 | 10/2008 | Wayman et al. |
| 2008/0262657 A1 | 10/2008 | Howell et al. |
| 2008/0271768 A1* | 11/2008 | Li ............... 135/16 |
| 2008/0292120 A1 | 11/2008 | Wilson |
| 2009/0014041 A1* | 1/2009 | Li ............... 135/16 |
| 2009/0056775 A1* | 3/2009 | Kuelbs ............... 135/16 |
| 2009/0058354 A1* | 3/2009 | Harrison ............... 320/101 |
| 2009/0065775 A1 | 3/2009 | Cheng |
| 2009/0071516 A1* | 3/2009 | Li ............... 135/16 |
| 2009/0120475 A1 | 5/2009 | Li |
| 2009/0120477 A1* | 5/2009 | Li ............... 135/16 |
| 2009/0193578 A1 | 8/2009 | Jang et al. |
| 2009/0196020 A1* | 8/2009 | Tsai ............... 362/102 |
| 2009/0250982 A1 | 10/2009 | Cohen |
| 2009/0284216 A1 | 11/2009 | Bessa et al. |
| 2009/0314319 A1 | 12/2009 | Young |
| 2009/0320827 A1 | 12/2009 | Thompson et al. |
| 2010/0024855 A1* | 2/2010 | Li ............... 135/16 |
| 2010/0024856 A1 | 2/2010 | Li |
| 2010/0097441 A1 | 4/2010 | Trachtenberg |
| 2010/0192999 A1 | 8/2010 | Li |
| 2010/0307547 A1 | 12/2010 | Li |
| 2010/0319737 A1 | 12/2010 | Li |
| 2010/0320819 A1 | 12/2010 | Cohen |
| 2010/0326849 A1 | 12/2010 | Trimarche |
| 2011/0005560 A1 | 1/2011 | Nair |
| 2011/0023931 A1 | 2/2011 | Chen |
| 2011/0066302 A1 | 3/2011 | McEwan |
| 2011/0157801 A1 | 6/2011 | Satterfield |
| 2011/0204912 A1* | 8/2011 | Root et al. ............... 324/754.07 |
| 2011/0227695 A1 | 9/2011 | Li |
| 2011/0265694 A1 | 11/2011 | Portis et al. |
| 2012/0017958 A1 | 1/2012 | Tarter et al. |
| 2012/0021269 A1 | 1/2012 | Tartar et al. |
| 2012/0073616 A1 | 3/2012 | Kuelbs |
| 2012/0140455 A1 | 6/2012 | Chang |

FOREIGN PATENT DOCUMENTS

| | | |
|---|---|---|
| DE | 9319387 U1 | 2/1994 |
| FR | 2628950 | 9/1989 |
| GB | 2396205 A | 6/2004 |
| JP | H08-158702 | 6/1996 |
| JP | 2002-204710 | 7/2002 |
| NL | 9301852 | 5/1995 |
| WO | WO 90/00840 | 1/1990 |
| WO | WO 90/06069 A | 6/1990 |
| WO | WO 93/05688 A1 | 4/1993 |
| WO | WO 98/49915 A1 | 11/1998 |
| WO | WO 00/13541 A1 | 3/2000 |
| WO | WO 02/069751 A1 | 9/2002 |
| WO | WO 03/092428 A1 | 11/2003 |
| WO | WO 2004/088076 A1 | 10/2004 |

OTHER PUBLICATIONS

Treasure Garden 2013 Product Catalog, copyright 2012, Treasure Garden, Inc., "Serenata Umbrella Lights", pp. 86-87.

* cited by examiner

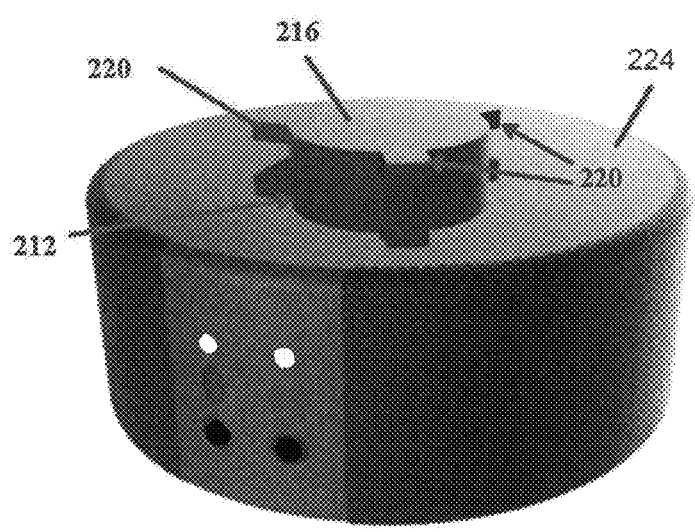
FIGURE 3A
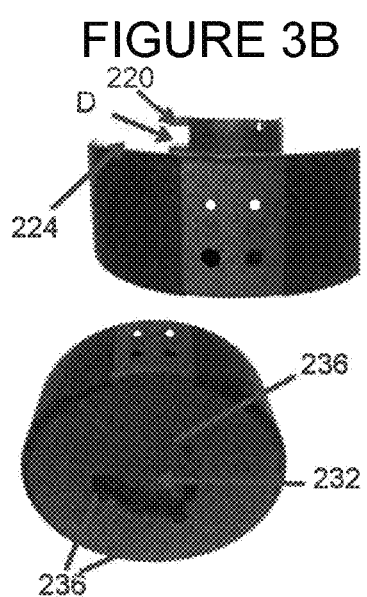
FIGURE 3B
FIGURE 3C

FIGURE 5A
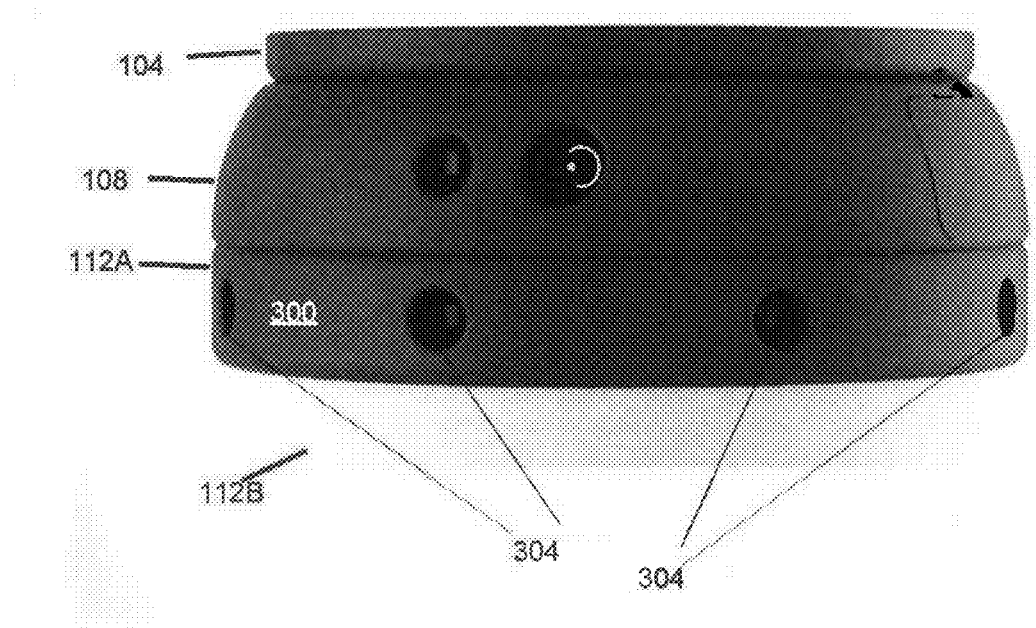
FIGURE 5B
FIGURE 5C
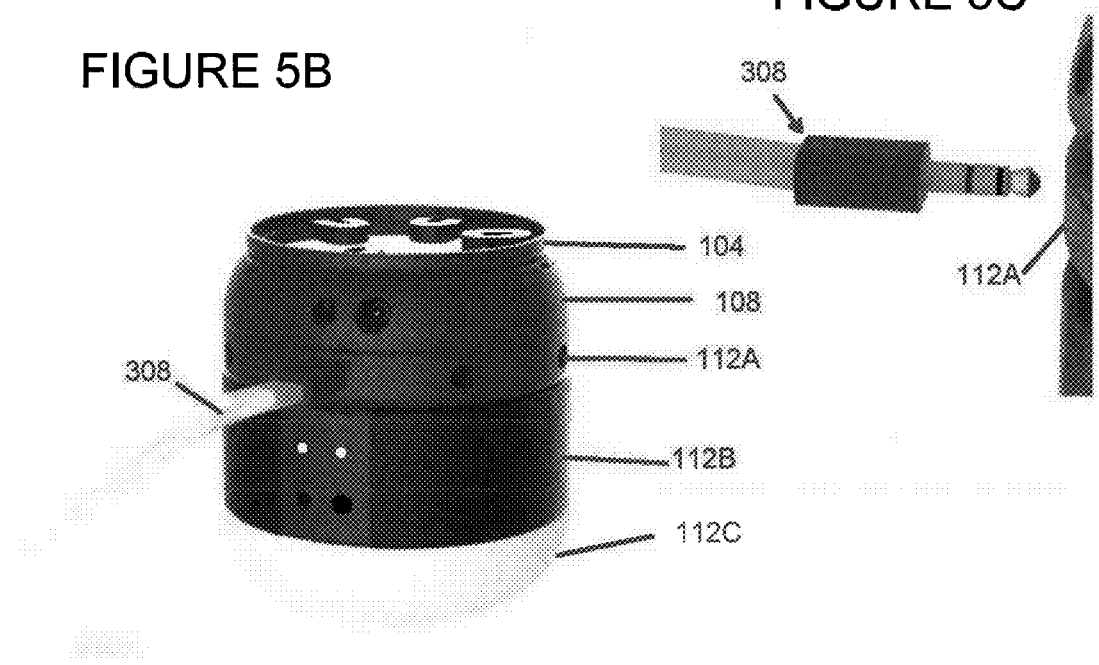

MODULAR ACCESSORY

BACKGROUND OF THE INVENTION

1. Field of the Invention

This application is directed to accessories for shade structures, including for umbrellas, pavilions, awnings, permanent patio coverings and other similar structures 2. Description of the Related Art Patio umbrellas and shade structures come in a variety of configurations. In some cases patio umbrellas are supported from the side, in a cantilevered arrangement. These umbrellas provide excellent shade while not obstructing the space with a central pole. While an umbrella is very useful in the daytime to provide shade, it is less useful after sunset and in some cases will be folded up and stored. However, in many settings space is limited and storing umbrellas in the evening is inconvenient. It would be beneficial to equip umbrellas so that storing them at night is not needed or better yet is not preferred. For example, it would be very useful for umbrellas to provide useful functions beyond providing shade to the user.

SUMMARY OF THE INVENTION

It would be advantageous to provide a media hub that can quickly and easily set up based on the preference of the user in an outdoor environment. Such a hub could be deployed on or with an umbrella or other shade structure, as discussed below. Accordingly, users will not need to store the umbrella at night time, but will prefer to keep them in position to provide additional functions, such as lighting, music, and other conveniences. Of course, the media hub provides many of the same benefits during the day.

In a first embodiment, a modular accessory is configured for mounting beneath a shade structure, e.g., a canopy of a cantilevered umbrella. The modular accessory can include a connection hub, a power supply module, and a plurality of functional modules. The connection hub has an upper portion, a lower portion, and a protrusion projecting away from the lower portion. The upper portion of the connection hub can be configured to connect a portion of a lower hub of a cantilevered umbrella. In some cases, the upper portion of the connection hub can form a portion of a lower hub of a cantilevered umbrella. The power supply module can have a lower side, an upper side, a socket, and a recess. The recess projects from the upper side toward the lower side of the power supply module. The protrusion of the connection hub is positionable in the recess of the power supply module to detachably connect the connection hub and the power supply module. For example, in some embodiments, the recess and projection have mating threads disposed thereon to provide a connection therebetween. The power supply module is configured to house a portable power supply or to receive power from an exterior source. The power supply module comprises one or more contacts disposed within the socket to transfer power. Each of the functional modules has an upper side, a lower side, and a plug. The plug is located at the upper side of the module. For example, the plug of a first functional module can be positioned within the socket of the power supply module to detachably connect the first functional module to the power supply module. The first functional module receives power from the power supply module when so connected. The plug of a second functional module can be positioned within a socket of the first functional module to detachably connect the second functional module and the first functional module. The second functional module receives power through a contact disposed in the socket of the first functional module when so connected.

In another embodiment, a modular accessory is provided for a cantilevered umbrella or other shade structure or overhead support. The modular accessory comprises a plurality of functional modules and a connection hub having an upper portion and a lower portion. The upper portion of the connection hub is configured to affix to an overhead structure, for example, being affixed to or forming a portion of a lower hub of a cantilevered umbrella. In some embodiments, the upper portion of the connection hub is arranged to detachably connect the connection hub to a cantilevered umbrella. The functional modules can have an upper side and a lower side, the upper side of at least one of the functional modules being configured to be detachably coupled with the connection hub. At least one of the functional modules has an upper side configured to connect with the lower side of another functional module. In some cases, the upper side of each functional module is configured to be detachably coupled with the connection hub or with the lower side of another functional module. In some cases, each functional module is detachable from the other module or modules. In some cases, each module is electrically connectable to a component disposed between the module and the connection hub.

In another embodiment, an accessory for a shade structure is provided. The accessory can be a media hub. In some embodiments, the accessory includes power supply module, a first functional module, and a second functional module. The power supply module can be configured to be suspended beneath an overhead support, such as a component of a shade structure. The first functional module is configured to affix to the power supply module and to be powered by the power supply module to provide a user directed function. The second functional module is configured to be detachably coupled to either the power supply module or the first functional module to receive power from the power supply module directly or through the first functional module.

BRIEF DESCRIPTION OF THE DRAWINGS

These and other features, aspects and advantages are described below with reference to the drawings, which are intended to illustrate but not to limit the inventions. In the drawings, like reference characters denote corresponding features consistently throughout similar embodiments.

FIGS. 3A-3C are different views of a functional module, in this case an audio module, including a perspective view (FIG. 3A), a side view (FIG. 3B), and a bottom perspective view (FIG. 3C).

FIG. 4A shows an exploded view of an assembly including the connection hub, a power supply module, and a power routing module. FIG. 4B is a side view of an assembly including the connection hub, a power supply module, and a cap.

FIGS. 5A-5C illustrate additional configurations of modular accessories as discussed herein.

DETAILED DESCRIPTION OF THE PREFERRED EMBODIMENTS

Figure 1:
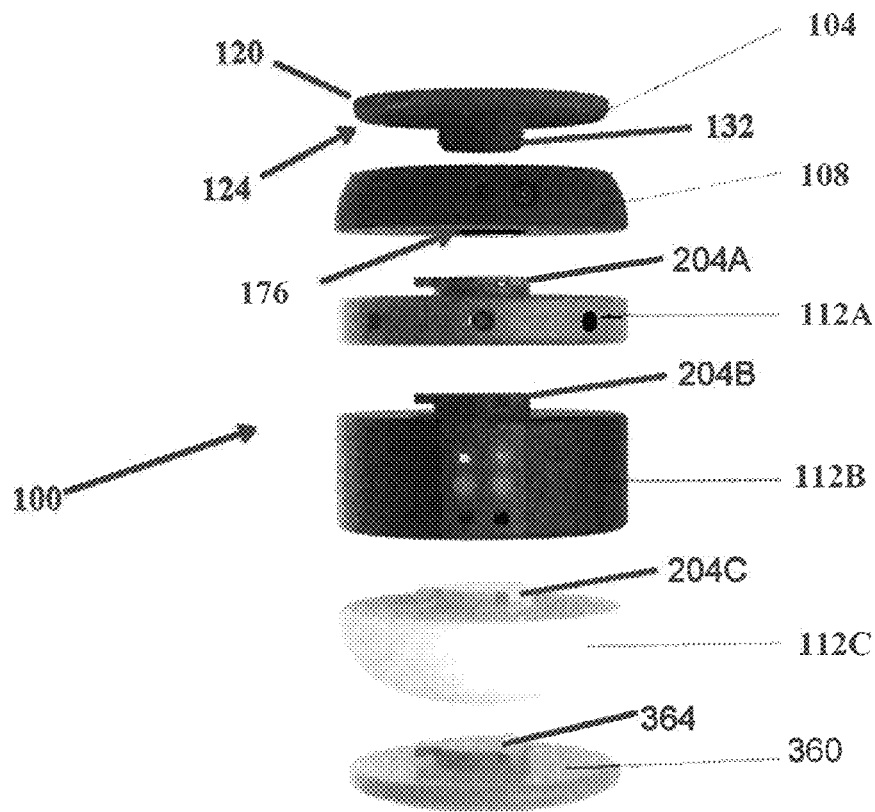
FIG. 1 is an exploded view of one embodiment of a modular accessory for an umbrella.

FIG. 1 shows an exploded view of a modular accessory 100 configured for mounting beneath a shade structure, e.g., a canopy of a cantilevered umbrella. The modular accessory 100 includes a connection hub 104, a power supply module 108, and a plurality of functional modules 112A, 112B, 112C. As discussed further below, various configurations of the modular accessory 100 provide some or all of the functional modules 112A, 112B, 112C. In some cases, more than three functional modules can be provided. In some cases, a hub system can be provided without any functional modules, but with the capability of connecting to functional modules sold separately. For example, the connection hub 104, power supply module and a cap could be sold as a unit with the other components sold separately and as options.

The connection hub 104 has an upper portion 120, a lower portion 124, and a connection device 128. The connection device 128 can be a protrusion projecting away from the lower portion 124. In the illustrated embodiment, the connection device 128 includes threads extending about the projection to mate with corresponding threads of one or more other components of the modular accessory 100. In one modified version of the connection hub 104, the connection device 128 is configured to be engaged by a non-threaded connection, such as the connection provided between the functional modules, discussed below. This would permit a cap configured to mate with the functional modules also be able to mate with the connection hub.

Figure 4A:
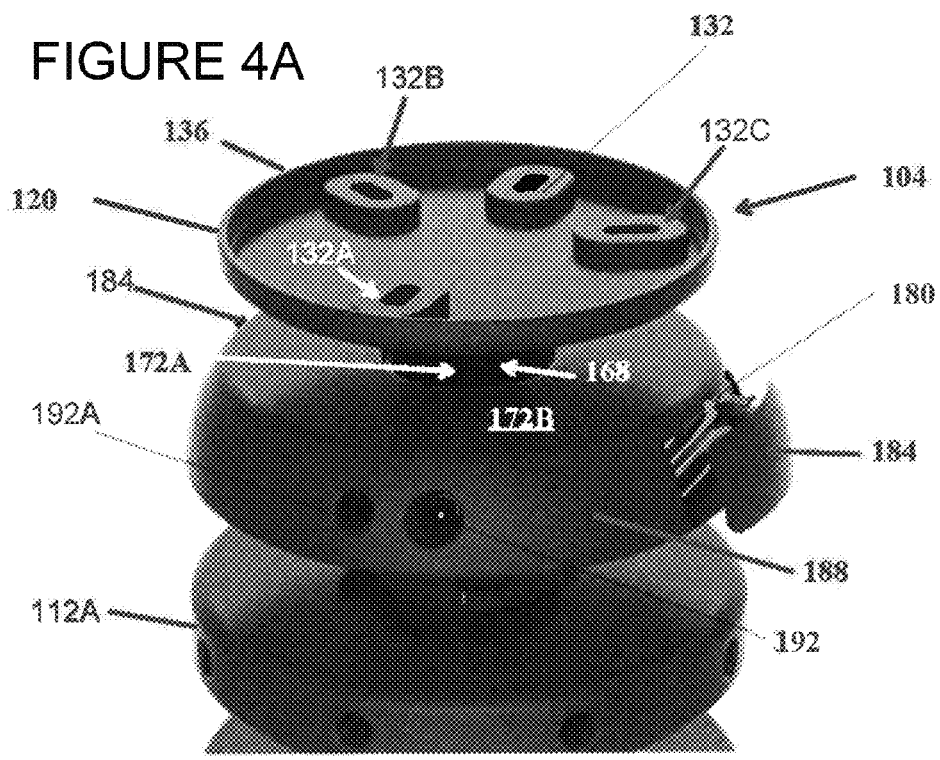
FIGS. 4A and 4B are different views of variations of the modular accessory, including a connection hub and a power supply module.

FIG. 4A illustrates that the upper portion 120 of the connection hub 104 can be configured to connect a portion of a lower hub of a cantilevered umbrella. For example, one or a plurality of mounting structures 132 can be provided on the upper portion 120. The mounting structures 132 can be configured to receive one or more fasteners that can be coupled with an umbrella hub. In one embodiment, a plurality of mounting structures 132 can be provided. The arrangement of the mounting structures 132 is such that the connection hub 104 can be coupled with a wide variety of umbrella hubs. For example, some umbrella hubs to which the connection hub 104 could be connected have a first connection pattern that can include three mounting structures 132 located approximately 120 degrees apart. For this arrangement, the mounting structures 132A, 132B, 132C are well suited to connect the connection hub 104 to the umbrella hub. This creates a triangular connection pattern, which provides a very secure connection. Other umbrella hubs may have connecting features that are aligned along an axis. For this arrangement, the mounting structures 132, 132A are well suited to connect the connection hub 104 to the umbrella hub. In the illustrated embodiment, each of the mounting structures 132, 132A-C have an elongated mounting region. This elongation enables some movement of the connection hub 104 relative to the umbrella hub to allow for small amounts of deviation in position either on the connection hub 104 or the umbrella hub to which it may connect.

FIG. 4A illustrates that the upper portion 120 can include an upwardly extending rim 136 that has a height that is equal to or exceeds the height of the mounting structures 132. This enables the top of the mounting structures 132 to be at or below a plane containing the rim 136. This adds to a pleasing aesthetic effect, hiding the mounting structures 132. In some cases, the connection hub 104 can form a portion of, e.g., is the lower surface of, a lower hub of a cantilevered umbrella. Examples of such an arrangement are shown in the following US Patents: U.S. Pat. No. 7,134,442, U.S. Pat. No. 7,493,909, U.S. Pat. No. 7,533,680, U.S. Pat. No. 7,708,022, U.S. Pat. No. 8,066,021. The connection device 128 could be built into a hub of any of the umbrellas illustrated in the foregoing patents, which are all incorporated by reference herein in their entirety. Or, the connecting device 128 could be removably or deployably connectable to a hub, as discussed in connection with FIGS. 3 and 10A-10C of U.S. Pat. No. 7,856,996, which is hereby incorporated by reference herein in its entirety.

The power supply module 108 can take any suitable form, but preferably is generally disc or annularly shaped. In one embodiment, the power supply module 108 has a generally flat configuration with a lower side 160 and an upper side 164. The upper side 164 can be configured to be positioned flush against a lower surface of the connection hub 104. For example, the upper side 164 can have a substantially planar surface. The lower surface of the connection hub 104 can be a substantially planar surface that abuts the planar surface of the upper side 164 when the projection 132 is received in a recess 168 of the power supply module 108.

In the illustrated embodiment, the power supply module 108 has a connection zone 172A, and a peripheral zone 172B. The connection zone 172A is an inner zone in one embodiment, e.g., closer a central axis of the power supply module 108. In this context, the central axis of the power supply module 108 may be an axis perpendicular to the lower or upper side 160, 164 and intersecting the geometric center thereof. The connection zone 172A may be a generally cylindrical portion of the power supply module 108. The connection zone 172A can include the recess 168 and/or a socket 176 that is configured to connect to a functional module, such as any of the plurality of functional modules 112A, 112B, 112C, as discussed below. In one embodiment, the connection zone 172A includes a plurality of walls with connection devices disposed thereon or therein. For example, a generally cylindrical wall projecting from the upper side 164 can include threads formed thereon to mate with threads on the projection 132. Another wall can extend from the lower side 160 to provide a portion of a connection device, as discussed in more detail below. The connection between the power supply module 108 and the connection hub 104 could be a non-threaded connection, similar to that adjacent to the lower sided 160.

The peripheral zone 172B can have any suitable configuration, for example providing an enclosed area 180 to hold batteries. In the illustrated embodiment, an access panel 184 is provided on a side surface 188 of the power supply module 108. The access panel 184 permits a user to access the area 180 so that batteries can be exchanged or replaced. In some embodiments, rechargeable batters can be used or power can be directly applied from an outside power source, or in some cases a plurality of outside power sources. For example, an AC source, e.g., through a power port 192A. The power port 192A enables the power supply module 108, and functional modules indirectly, to receive power from an external source. In one variation another power port 192 is provided that can be connected to a different power source, e.g., to a solar panel for renewable recharging of batteries in the power supply module 108. In the illustrated embodiment, the power ports 192, 192A have different configurations, e.g., one can be larger than the other. This ensures that the user will connect the right sort of power source to each of the ports 192, 192A. This is important in some embodiments where the electronics within the power module 108 have different components and ratings specific to they type of power source to be connected to the port. Where rechargeable batteries are used, the access panel 184 may be omitted in favor of an arrangement where the end user is not permitted access to the batteries. The peripheral zone 172B can extend substantially entirely around the power supply module 108, e.g., being disposed at least at opposite sides of the power supply module 108, as shown.

Figure 2A:
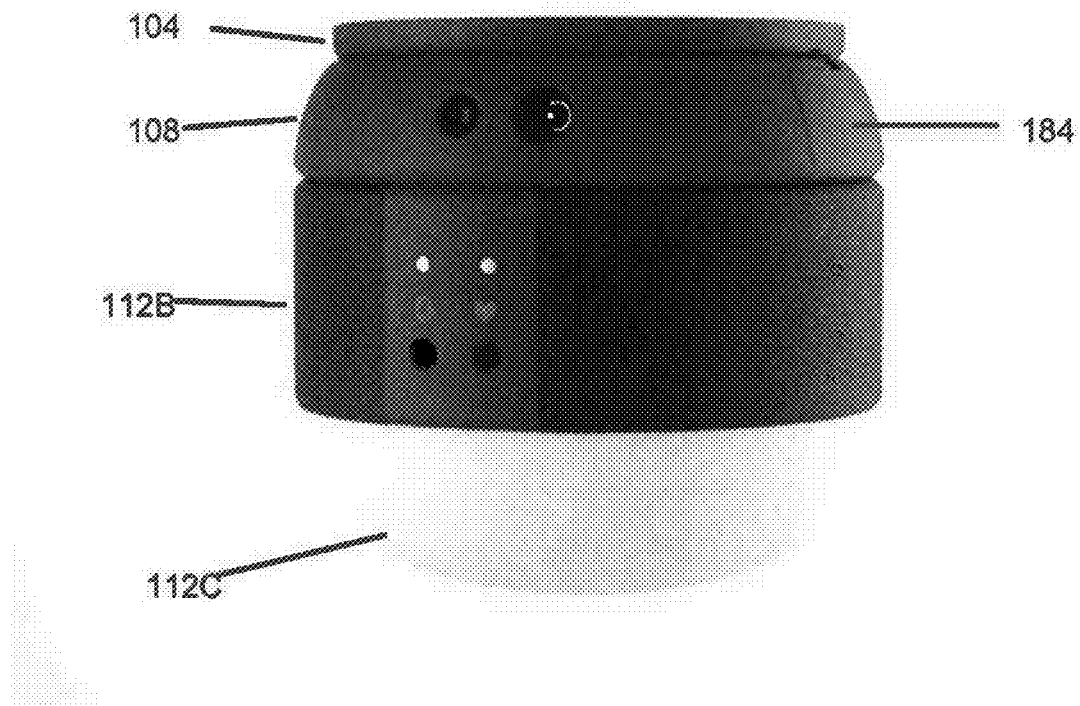
FIGS. 2A and 2B show different configurations of the modular accessory of FIG. 1.
Figure 2B:
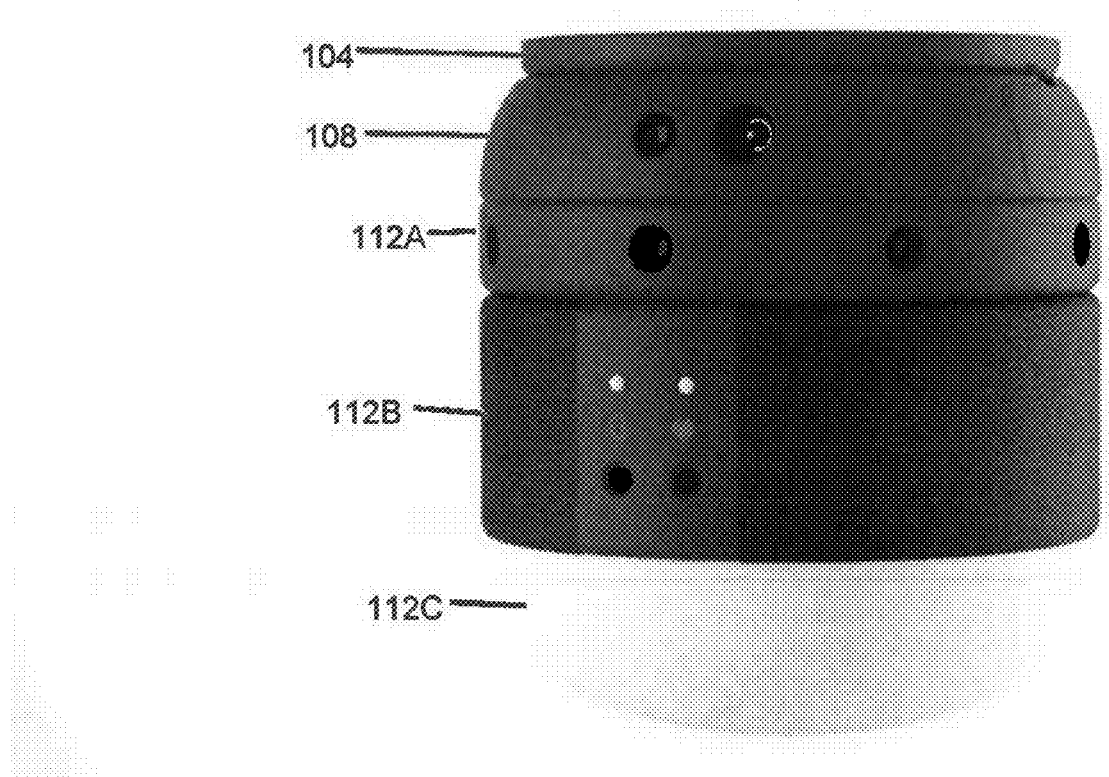

A side profile of the power supply module 108 shows that the side surface 188 can have a slight curvature, as shown in FIG. 2B such that the upper side of the surface 188 matches the size of the lower portion 124 of the connection hub 104 and a lower side of the surface 188 matches the profile, e.g., lateral dimension of one or more of the modules 112A, 112B, 112C. This provides a gently sloping appearance and can permit the modular accessory 100 to be generally cylindrical overall, at least in the zone of the modules 112A and 112B.

To detachably connect the connection hub 104 and the power supply module 108, the protrusion 132 of the connection hub 104 is positioned in the recess 168 of the power supply module. In one embodiment, where mating threads are provided the protrusion is advanced into the recess by relatively rotating the hub 104 and power supply module 108 through a plurality of revolutions. If a non-threaded connection is provided the connection could be made by only fractional of a revolution.

Connection of the power supply module 108 to any of the functional modules is illustrated by the operation of the functional module 112B, which is an audio module. The module 112B includes a load bearing electrical connector 204. The connector 204 is provided above an upper surface 224 of the module 112B. As can be seen from FIG. 3A, the connector 204 has an insertable member 212 projecting away from the upper surface 224. The insertable member 212 can take any suitable configuration. In one embodiment, the insertable member 212 includes a cylinder that extends upward from the surface 224 to a free end 216. The free end 216 can include a plurality of lateral projections 220. The projections 220 can extend generally laterally of a central axis of the module 112B, i.e., an axis that is perpendicular to the free end 216. As shown the projections 220 can be lateral projections spaced about the periphery of the insertable member 212, e.g., spaced by equal angles. FIG. 3B shows that the projections 220 can be disposed away from the top surface 224 of the module 112B by a distance D.

The insertable member 212 preferably forms a load-bearing connection between the module 112B and a component disposed above the module 112B. FIG. 2A illustrates that the module 112B can be coupled directly with the power supply module 108. One advantage of the connector 204 is that is provide for both electrical and load-bearing connection between the module 112B the component to which it attaches, e.g., the power supply module 108. One particularly convenient arrangement of the connection between the connector 204 and the socket 176 is that the coupling therebetween can have two configurations. In a first configuration substantially no load is supported. This configuration can be achieved by moving the module 112B toward the other component to which it is to be coupled. In a second configuration, a load-bearing connection is provided. The connector is disposed in the socket 176 and is supported therein and also makes connection with an electrical contact therein. A connection between the connector 204 and the socket 176 is sufficient to support the weight of a single one of the modules 112A, 112B, 112C or all of the modules 112A, 112B, 112C and in some cases more than three modules.

In one embodiment, the connection between the module 112B and the socket 176 comprises a recess having one or more laterally extending portions. Although the lower surface of the power supply module 108 is not shown a similarly configured recess 232 in the module 112B is shown in FIG. 3C. The recess 232 includes a laterally extending region 236 corresponding to each projection 220. To connect the module 112B to the power supply module 108, the insertable member can be translated upward into the socket 176 such that the surface 216 is within the socket 176 at a depth of at least D. Thereafter, the module 112B is rotated to dispose the projection(s) 220 over a support surface. This can be achieved by rotating by an amount greater than the width of the projections 220. In the module 112B, the surface can be seen in FIG. 3C, located circumferentially between two adjacent laterally extending regions 236. The rotation can be less than 90 degrees, and in some embodiments as little as 10 degrees. As discussed more below, in some cases the projections 220 have different widths. In that case the amount of rotation is at least about one-half the width of and in most cases about the full width or more than the width of the narrowest projection. This connection is very convenient because it requires relatively little rotation. This arrangement can be quickly and easily coupled and decoupled, facilitating rapid re-configuration of the modular component.

FIG. 1 shows that each of the functional modules 112A, 112B, 112C, has an upper side, a lower side, and a connector 204A, 204B, 204C. The connectors 204A, 204C function in a manner similar to that of connector 204B. Thus, any or all of the modules can be connected in any combination or order as discussed below.

The first functional module 112A can comprise a power routing module. As shown in FIGS. 5B and 5C, in this configuration a side surface 300 of the module 112A can comprise a plurality of power sockets 304. The power sockets can connect to additional components that can be powered by the power routing module. For examples, as shown in FIG. 5B flexible strings of lights 308 can be connected to one or more of the sockets 304 to provide lighting as desired. In one embodiment, the strings of lights can be connected to supporting ribs that extend from a lower hub of an umbrella to canopy support ribs adjacent to the canopy to provide a lighting effect.

Although FIG. 5B shows the flexible lights 308 in use with the module 112B, in other combinations, the module 112B can be omitted form this combination. For example, where only lighting is desired a combination could include the lights 308 and the module 112C, while omitting the module 112B.

Figure 4B:
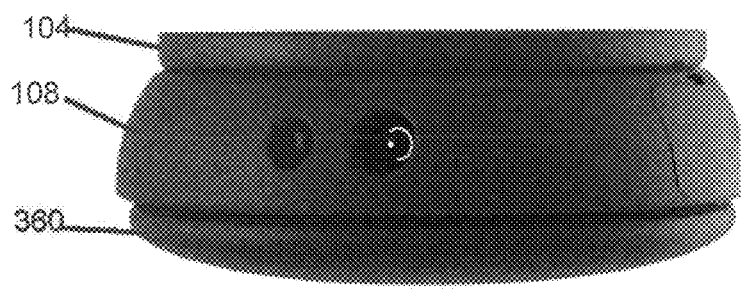

FIG. 2A shows a modular accessory 100A that can be provided in which the accessory is shortened by removing a module. In this combination, the power routing module 112A is removed. This provides a more compact arrangement where only the audio module 112B and the lighting module 112C are needed. FIG. 4B shows a further shortened configuration in which all functional modules are removed. In this arrangement, the connection hub 104 and the power supply module 108 are connected and a cap 360 is provided on the lower side 160 thereof. The cap 360 is shown in more detail in FIG. 1. In general, the cap 360 has a connector 364 that is similar to the connector 204A. As such, upon removal of the functional module 112A, the cap 360 can be placed onto the power supply module 108 to cover the socket 176. The arrangement of FIG. 4B advantageously enables the more complex and costly, and more easily removable components to be removed and stored in a secure location.

In some variations of the modular accessory 100, the cap 360 is used as a power conserving feature. For example, removing the dome light of the module 112C and replacing it with the cap 360 prevents the light from drawing power from the power module 108, thereby preserving the battery. This will allow the other powered devices, such as the audio components of the module 112C, to operate longer on the same batteries or on a single charge. Alternatively, if the user needs more light, the cap 360 can be removed and the dome light of the module 112C mounted beneath the connection hub 104, as shown in FIGS. 2A, 2B, 5A, 5B, and 8D. For example, FIG. 5A provides another configuration in which the power routing function of the functional module 112A is combined with the lighting of the functional module 112C to provide light and flexible power usage. For example, additional lights or other electrical components can be connected to the module 112A while providing light through a dome light of the module 112C. FIG. 2B shows an extended configuration, which includes the power routing module 112A.

As noted above, where multiple functional modules are provided power is passed between the modules, for example from an upper to a lower functional module. In one arrangement, the power routing module 112A is a first module that receives power from the power supply module 108 when connected. A connector 204B of the audio module 112B, which is a second functional module, is positioned in the socket 176 of the module 112A. The connection between the connector 204B and the socket 176 detachably connects the second functional module 112B to the first functional module 112A. The second functional module receives power through a contact disposed between the connector 204B and the socket 176.

Figure 6:
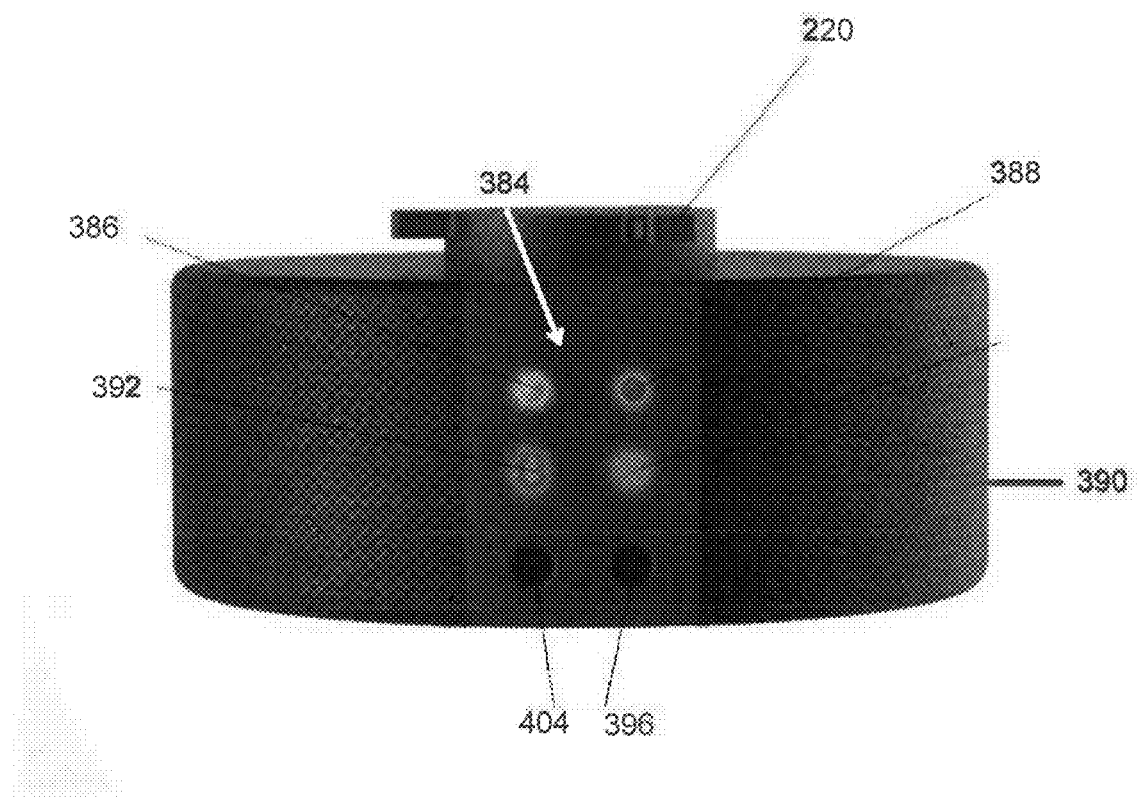
FIG. 6 is a side view illustrating additional features of one embodiment of an audio module.
Figure 7:
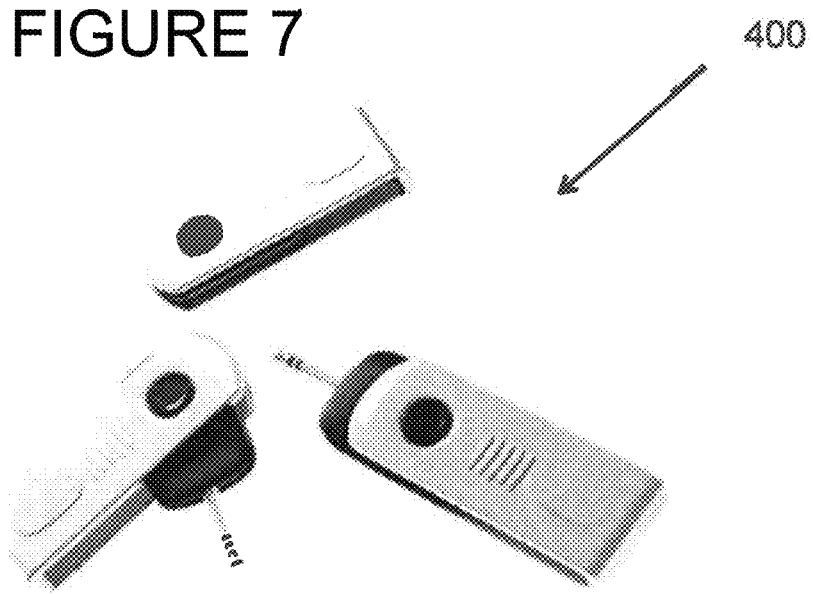
FIG. 7 show an example of a further accessory that could be coupled with the audio module of FIGS. 3A-C and 6.

FIGS. 6 and 7 show additional details of audio systems that can be provided as part of a modular accessory. In addition to the feature discussed above, the module 112B can include one or more speakers 390 and a control panel 384. The control panel 384 can include a plurality of lights that indicate various operational parameters. For example, a first light 386 can indicate that power is being supplied to the module 112B and/or that the module is actually turned on. In some cases, a diagnostic indicator 388 is provided that can immediately and/or visually indicate to the user some operational state of the module 112B. The diagnostic indicator 388 illuminates in some embodiments when the module 112B is malfunctioning. Also, the module 112B can include a wireless networking component 392 that enables data to be provided to or from the module 112B. For example, a wireless device can provide music files wirelessly to the module 112B to be played audibly on the speakers 390. The networking component 392 can be a Bluetooth wireless component. A fourth indicator light (lower right in the figure) is provided for future functionality, such as second or supplemental wireless connectivity. Other modules could be modified to include a control panel similar to the panel 384.

Rather than or in addition to wireless transmission, the module 112B can be provided with one or more data ports 396 that enable a portable memory device (not shown) to be coupled with the module 112B to provide data to the module. An audio-out port 404 could be provided for connecting the module 112B to other component, such as auxiliary speakers, by wire.

FIG. 7 illustrates an accessory 400 that can be paired with the modular accessory 100. The accessory 400 is a transmitter for wirelessly coupling media content from a remote device to the module 112B. The remote device can be an electronic music player, a tablet computer, a smart phone or other device with an audio or data out port. The accessory 400 enables wireless transmission of the audio or data output to the module 112B in one embodiment.

Figure 8A:
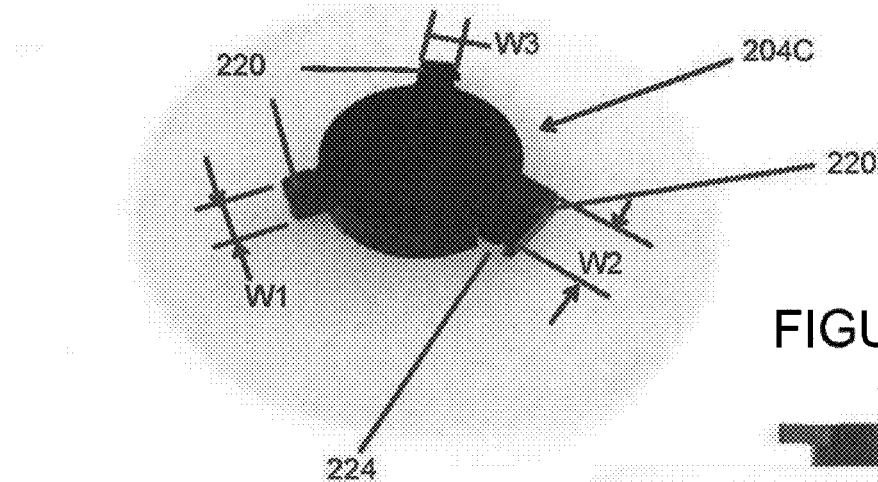
FIGS. 8A-8D show different views of a dome light and a dome light assembly.
Figure 8B:
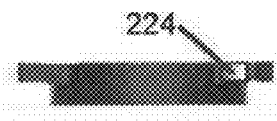
Figure 8C:
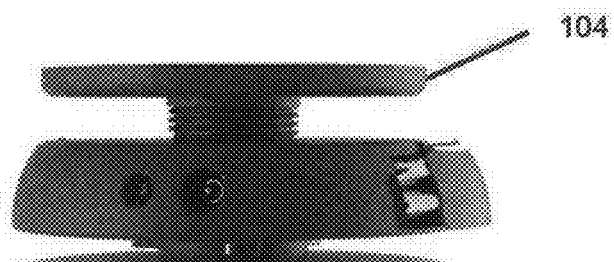
Figure 8D:
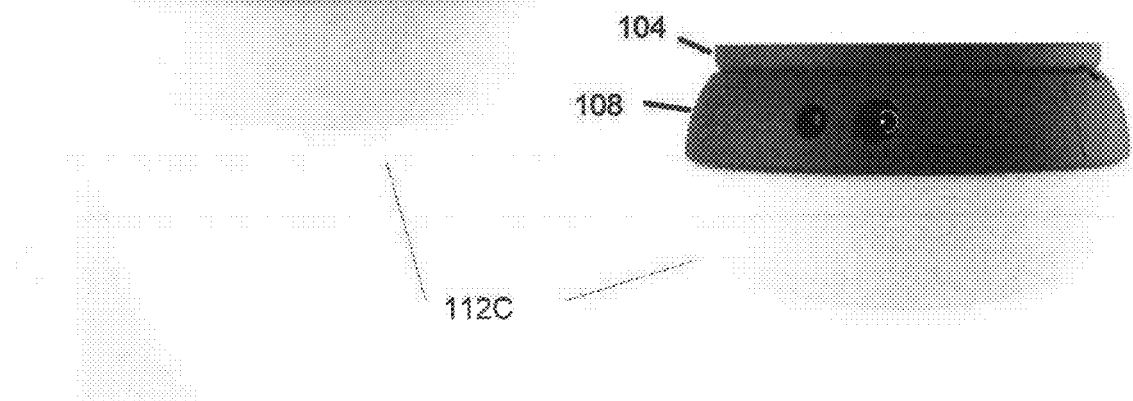

FIGS. 8A-8D illustrate another, simple variation of the modular accessory 100 in which a light module is provided. In particular, from top to bottom the variation of FIGS. 8A-8D include the connection hub 104, the power supply module 108, and the functional module 112C. FIG. 8A illustrates the connector 204C well. In particular, lateral projections 220 can be seen to have electrical contact 224 on side surfaces thereof. These contacts will not receive power from the power supply module 108 unless the light is moved from the first non-load-bearing configuration discussed above to a position that is relatively rotated from the position of the first configuration. Upon rotation, the contacts 224 are brought into directly engagement with contacts within the socket 176 of the power supply module 108. In the illustrated embodiment, the projections 220 are not all the same. In particular, two of the connections have less width between their lateral edges than the third projection. In one example, a width W1 is provided for one of the projections, a width W2 greater than W1 is provided for one of the projections, and a width W3 less than W1 is provided for a third projection 220. This arrangement guarantees a specific rotational position when the module 112C connects to a module above it. This configuration of the connector 204C can be provided between each level of the modular accessory 100. Providing rotationally specific connection can be achieved with two different widths of the connections in some embodiments, e.g., with W3 equal to W1. In other embodiments, the projections 220 all have the same width where a specific rotational orientation is not required.

As noted above, the modular accessory 100 can be constructed by assembling various components. The connection hub 104 can be the interface between the modular accessory and the umbrella or other shade structure or overhead support. The mounting structures 132 of the connection hub 104 are the interface at which the umbrella or other shade structure or overhead support and the modular accessory connect.

The connection hub 104 enables the user to interface various components with umbrella. For example, if the user decides to replace the umbrella because it is broken or unsatisfactory, the user can do so while continuing to use the modular accessory 100. Or components of the modular accessory 100 can be moved from umbrella to umbrella.

The embodiment of the threaded mounting structure 132 provides a few advantages. First, the connection between the connection hub 105 and the power supply module 125 may be stronger that other connections. Second, the threaded lower protrusion looks and operates differently from the connection mechanisms used by the other modules. This unique feature of the connection hub 104 prevents connecting the modules 112A, 112B, 112C directly to the connection hub 104 for arrangements where the power supply module 108 is to be disposed above all of the modules 112A, 112B, 112C.

The various different configurations reveal some of the benefits of the module accessory 100. First, the modular accessory 100 can be shortened to just the connection hub 104 or can be extended by adding additional modules 108, 112A, 112B, 112C, etc., to the modular accessory 100. Similarly, these configurations also show that the modular accessory 100 can be provided with a full compliment of functional modules, but can thereafter be shortened or streamlined to have less than all of the modules.

The ability to add or remove functional modules enhances the modular accessory 100 for the user. This provide greatest flexibility for the user and enables power conservation modes and/or higher headroom modes (e.g., where the lowest point of the module 100 is higher to be out of the way). By making some or all of the functional modules 112A, 112B, 112C substantially the same side profile or width, the look of the accessory 100 is generally uniform in all of its various configurations. Thus, the accessory 100 has a sleek columnar look.

Although these inventions have been disclosed in the context of certain preferred embodiments and examples, it will be understood by those skilled in the art that this application extends beyond the specifically disclosed embodiments to other alternative embodiments and/or uses of the invention and obvious modifications and equivalents thereof. In addition, while a number of variations of the inventions have been shown and described in detail, other modifications, which are within the scope of the inventions, will be readily apparent to those of skill in the art based upon this disclosure. It is also contemplated that various combinations or sub-combinations of the specific features and aspects of the embodiments may be made and still fall within the scope of the application. For example, the application contemplates the connection hub alone or in combination with any of the other modules could comprise a separate aspect. Or, any one or a combination of the modules could be directly connected to an umbrella hub or overhead support to form another separate aspect. Accordingly, it should be understood that various features and aspects of the disclosed embodiments can be combined with or substituted for one another in order to form varying modes of the disclosed embodiments. Thus, it is intended that the scope of the present invention herein disclosed should not be limited by the particular disclosed embodiments described above, but should be determined only by a fair reading of the claims that follow.

Similarly, this method of disclosure, is not to be interpreted as reflecting an intention that any claim require more features than are expressly recited in that claim. Rather, as the following claims reflect, inventive aspects lie in a combination of fewer than all features of any single foregoing disclosed embodiment. Thus, the claims following the Detailed Description are hereby expressly incorporated into this Detailed Description, with each claim standing on its own as a separate embodiment.

What is claimed is:

1. A modular accessory for mounting beneath a canopy of a cantilevered umbrella, the modular accessory comprising:
    a connection hub comprising an upper portion, a lower portion, and a threaded protrusion projecting away from the lower portion, the upper portion of the connection hub being configured to connect to or forming a portion of a lower hub of a cantilevered umbrella;
    a power supply module comprising a power supply housing having a lower side and an upper side, a threaded recess projecting from the upper side of the power supply housing toward the lower side of the power supply housing, and a socket located at the lower side of the power supply housing, the socket comprising one or more contacts to transfer power, the power supply housing enclosing a portable power supply or receiving power from an exterior source;
    a plurality of functional modules, each functional module comprising a module housing having an upper side and a lower side, a socket located at the lower side of the module housing and having an electrical contact disposed therein, and a plug located at the upper side of the module housing; and
    at least two arrangements wherein the connection hub, power supply module, and at least two functional modules form a unitary structure, wherein, in a first arrangement:
        the threaded protrusion of the connection hub is positioned in the threaded recess of the power supply housing to detachably connect the power supply housing to the connection hub;
        the plug of a first functional module housing is positioned in the socket of the power supply housing to detachably and directly connect the module housing of the first functional module to the power supply housing, the first functional module receiving power from the power supply module; and
        the plug of a second functional module housing is positioned in the socket of the first functional module housing to detachably and directly connect the module housing of the second functional module to the module housing of the first functional module, the second functional module receiving power through the contact disposed in the socket of the first functional module housing, and
    wherein, in a second arrangement:
        the threaded protrusion of the connection hub is positioned in the threaded recess of the power supply housing to detachably connect the power supply housing to the connection hub;
        the plug of the second functional module housing is positioned in the socket of the power supply housing to detachably and directly connect the module housing of the second functional module to the power supply housing, the second functional module receiving power from the power supply module; and
        the plug of the first functional module housing is positioned in the socket of the second functional module housing to detachably and directly connect the module housing of the first functional module to the module housing of the second functional module, the first functional module receiving power through the contact disposed in the socket of the second functional module housing.

2. The accessory of claim 1 wherein the functional modules comprise a light module, a power module, and an audio module.

3. The accessory of claim 1, further comprising a cap having an upper side, a lower side and a plug, the plug located on the upper side of the cap, the plug of the cap being positionable into the socket of any of the functional module housings or the power supply housing to detachably connect the cap thereto.

4. The accessory of claim 3, wherein the cap is a domed light that receives power through a contact disposed in the socket of the housing detachably connected to the cap.

5. The accessory of claim 3 wherein any functional module can be interchangeable with any other functional module.

6. The accessory of claim 5 wherein the accessory can be extended by inserting an additional functional module between the cap and the power supply module.

7. The accessory of claim 3, wherein a functional module can be removed from the accessory to shorten the accessory, the remaining functional module(s) being connectable to one or both of the power module and the cap.

8. The accessory of claim 1 wherein the unitary structure comprises a columnar arrangement.

9. A modular accessory for a cantilevered umbrella, comprising:
    a connection hub having an upper portion and a lower portion, the upper portion of the connection hub being configured to affix to or forming a portion of a lower hub of a cantilevered umbrella to detachably connect the connection hub to the cantilevered umbrella;
    a plurality of functional modules, each functional module comprising a housing having a width greater than a height, each functional module housing having an upper side and a lower side, the upper side configured to be detachably coupled with the connection hub or with the lower side of another functional module housing, each functional module housing being detachable from the other module housing or housings, and each module being electrically connectable to a component disposed between the module and the connection hub; and at least two arrangements forming a columnar structure extending along a longitudinal axis, the at least two arrangements comprising at least the connection hub, a first functional module, and a second functional module, wherein a first arrangement comprises the first functional module detachably connected to the second functional module, the lower side of the housing of the first functional module being adjacent the upper side of the housing of the second functional module, and wherein a second arrangement comprises the second functional module detachably connected to the first functional module, the lower side of the housing of the second functional module being adjacent the upper side of the housing of the first functional module.

10. The accessory of claim 9, further comprising a power supply module comprising a housing having a lower side and an upper side, the upper side of the power supply housing being configured to affix to the connection hub to detachably connect the power supply module to the connection hub.

11. The accessory of claim 9, further comprising a domed light cap having an upper side and a lower side, the upper side being configured to affix to the lower side of any functional module housing or the connection hub to detachably connect the domed light cap to any functional module or the connection hub.

12. The accessory of claim 11 wherein the upper side of either the domed light cap or any functional module housing comprises an insertable connector integrally formed or rigidly attached thereto and the lower side of the power supply housing or any functional module housing comprises a socket integrally formed or rigidly attached thereto configured to receive any of the insertable connectors.

13. The accessory of claim 10 wherein at least one functional module is configured to receive power from either the power supply module or another functional module and is further configured to transfer power to another functional module.

14. An accessory for a shade structure, comprising:
a power supply module configured to be suspended beneath a component of a shade structure;
a first functional module and a second functional module each comprising a power transfer support integrally formed or rigidly attached to the functional module, the power transfer support comprising at least two tabs radially extending from a central body, the tabs each comprising an electrical connector, the first functional module configured to affix to either the power supply module or the second functional module and to receive power through the electrical connectors of the tabs from the power supply module directly or through the second functional module,
the second functional module configured to be detachably coupled to either the power supply module or the first functional module to receive power through the electrical connectors of the tabs from the power supply module directly or through the first functional module; and
at least two arrangements forming a unit comprising at least the power supply module, the first functional module, and the second functional module, wherein a first arrangement comprises the first functional module affixed to the power supply module and the second functional module affixed to the first functional module, wherein the power transfer support of the first functional module supports a weight of both the first functional module and the second functional module, and wherein a second arrangement comprises the second functional module affixed to the power supply module and the first functional module affixed to the second functional module, wherein the power transfer support of the second functional module supports a weight of both the second functional module and the first functional module.

15. The accessory of claim 14, further comprising an umbrella hub or runner having a mounting structure configured to connect to the power supply module.

16. The accessory of claim 15, further comprising a cap having an upper side and a lower side, the upper side being configured to affix to a lower side of any functional module or the mounting structure to detachably connect the cap to any functional module or the power supply module.

17. The accessory of claim 14, wherein the first functional module comprises a light hub having a plurality of light sockets disposed about a periphery thereof and the second functional module comprises an audio module.

18. The accessory of claim 14, wherein the power transfer supports can be inserted into a mating socket of the power supply module or a functional module in at least two configurations comprising a first configuration in which substantially no load can be supported and a second configuration in which the power transfer support supports at least the weight of all of the modules of the accessory disposed below the power transfer support, wherein selecting a configuration comprises rotating the power transfer support within the mating.

19. The accessory of claim 18, wherein the power transfer support of at least one of the functional modules is disposed on an upper side thereof and the mating socket of at least one of the functional modules and the power supply module is disposed on a lower side thereof, the socket having a laterally extending region.

20. The accessory of claim 19, wherein the second configuration is provided by rotating the tabs of the power transfer support in a space within the mating socket such that the tabs are moved from the laterally extending region to a location above a support member of the socket.

21. The accessory of claim 18, wherein the first configuration is provided by moving an upper surface of one of the functional modules upward relative to another functional module or upward relative to the power supply module and the second configuration is provided by rotating the upwardly-moved functional module relative to the other functional module or the power supply module.

22. The accessory of claim 14, wherein the accessory has a generally constant lateral dimension at least at the boundary between the first and second functional modules and between the power supply module and one of the functional modules.

23. The modular accessory of claim 9, wherein the columnar structure comprises at least two functional modules having a same outside diameter.

24. The accessory of claim 18, wherein the electrical connectors of the tabs are positioned at a side of the tabs, such that rotating the power transfer support into the second configuration closes an electrical connection between the electrical connectors of the tabs and mating electrical connectors of the mating socket.

* * * * *

UNITED STATES PATENT AND TRADEMARK OFFICE
CERTIFICATE OF CORRECTION

| | | |
|---|---|---|
| PATENT NO. | : 9,030,829 B2 | Page 1 of 1 |
| APPLICATION NO. | : 13/657116 | |
| DATED | : May 12, 2015 | |
| INVENTOR(S) | : Oliver Joen-an Ma | |

It is certified that error appears in the above-identified patent and that said Letters Patent is hereby corrected as shown below:

Specification

In column 1 at line 8, Change "structures" to --structures.--.

In column 4 at line 51, Change "batters" to --batteries--.

In column 4 at line 66, Change "they" to --the--.

In column 8 at line 58, Change "compliment" to --complement--.

Claims

In column 12 at line 35 (approx.), In Claim 18, change "mating." to --mating socket.--.

Signed and Sealed this
Twenty-second Day of March, 2016

Michelle K. Lee
*Director of the United States Patent and Trademark Office*